(12) United States Patent
Kim et al.

(10) Patent No.: US 10,185,862 B2
(45) Date of Patent: Jan. 22, 2019

(54) FINGER PRINT SENSOR AND MANUFACTURING METHOD THEREOF

(71) Applicant: Amkor Technology, Inc., Tempe, AZ (US)

(72) Inventors: Seung Mo Kim, Yongin-si (KR); Chang Hun Kim, Seoul (KR); Jung Hwa Kim, Seoul (KR); Se Man Oh, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 197 days.

(21) Appl. No.: 15/092,183

(22) Filed: Apr. 6, 2016

(65) Prior Publication Data

US 2016/0300096 A1 Oct. 13, 2016

(30) Foreign Application Priority Data

Apr. 7, 2015 (KR) .......................... 10-2015-0049153

(51) Int. Cl.
*G06K 9/20* (2006.01)
*G06K 9/00* (2006.01)

(52) U.S. Cl.
CPC .................................. *G06K 9/0002* (2013.01)

(58) Field of Classification Search
CPC .................................................... G06K 9/0002
See application file for complete search history.

(56) References Cited

U.S. PATENT DOCUMENTS

| 8,334,590 B1* | 12/2012 | Jung ..................... H05K 1/186 |
| | | 257/698 |
| 2014/0341448 A1* | 11/2014 | Chiu ..................... G06K 9/0002 |
| | | 382/124 |
| 2016/0104024 A1* | 4/2016 | Slogedal .............. G06K 9/0002 |
| | | 324/649 |
| 2016/0295691 A1* | 10/2016 | Furuta ..................... G06F 3/041 |
| 2017/0140195 A1* | 5/2017 | Wang ................... G06K 9/0002 |

\* cited by examiner

*Primary Examiner* — Brian Werner
(74) *Attorney, Agent, or Firm* — McAndrews, Held & Malloy, Ltd.

(57) ABSTRACT

A fingerprint sensor device and a method of making a fingerprint sensor device. As non-limiting examples, various aspects of this disclosure provide various fingerprint sensor devices, and methods of manufacturing thereof, that comprise a substrate comprising a dielectric layer and a wiring pattern embedded in and exposed from the dielectric layer.

20 Claims, 8 Drawing Sheets

FINGER PRINT SENSOR AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0049153, filed on Apr. 7, 2015, in the Korean Intellectual Property Office and titled "PACKAGE OF FINGERPRINT SENSOR AND FABRICATING METHOD THEREOF," the contents of which are hereby incorporated herein by reference in their entirety.

BACKGROUND

Present semiconductor packages and methods for forming sensor devices (e.g., fingerprint sensor devices) are inadequate, for example resulting in inadequate sensing accuracy and/or device reliability. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
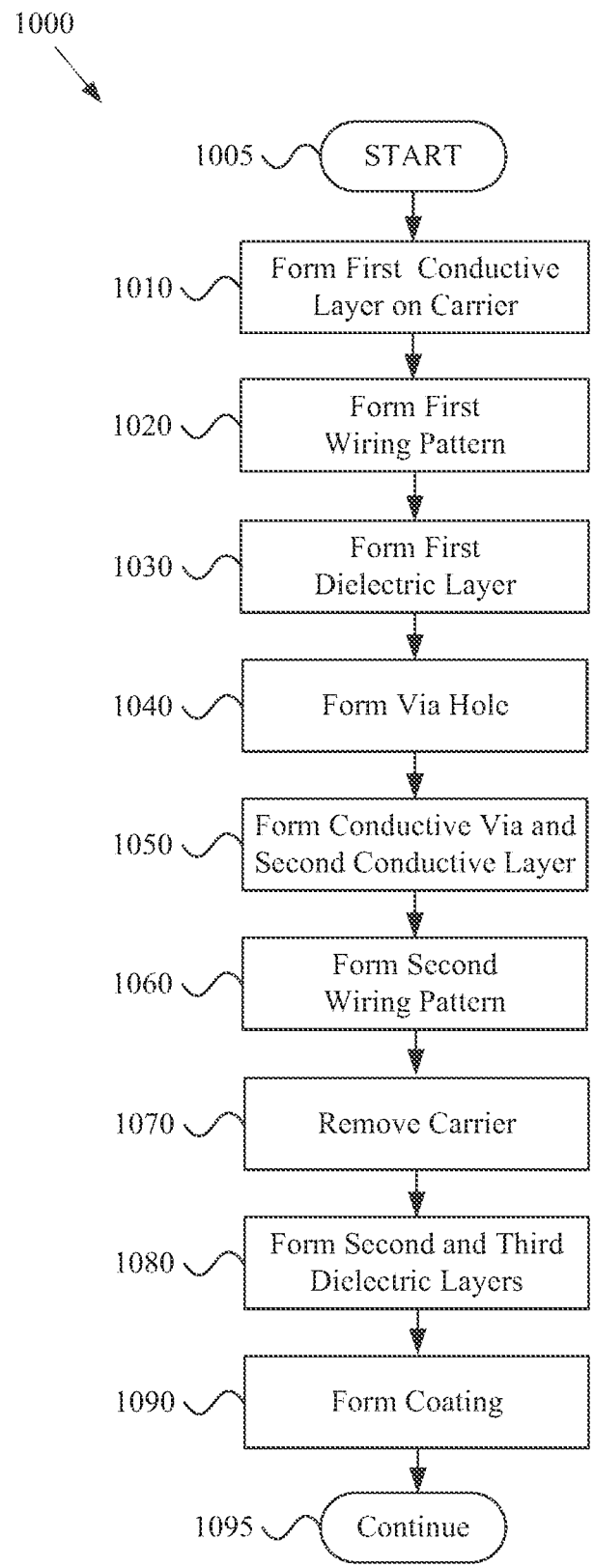
FIG. 1 shows a flow diagram of an example method of making a sensor device, in accordance with various aspects of the present disclosure.

Various aspects of this disclosure provide a fingerprint sensor device and a method of making a fingerprint sensor device. As non-limiting examples, various aspects of this disclosure provide various fingerprint sensor devices, and methods of manufacturing thereof, that comprise a substrate comprising a dielectric layer and a wiring pattern embedded in and exposed from the dielectric layer.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

Further, it should be understood that when an element A is referred to as being "connected to" or "coupled to" an element B, the element A can be directly connected to the element B or indirectly connected to the element B (e.g., an intervening element C (and/or other elements) may be positioned between the element A and the element B).

It should be understood that although the examples presented herein primarily concern fingerprint sensors and manufacturing methods thereof, the scope of this disclosure is not limited thereto. The various aspects of this disclosure, for example, are readily applicable to other forms of sensors (e.g., blood vessel sensors, temperature sensors, humidity sensors, image sensors, general biometric sensors, eye or retinal sensors, voice sensors, material detectors, etc.).

Additionally, it should be understood that the examples present herein are not limited to any particular type of fingerprint sensing (e.g., an optical sensing type, a semiconductor sensing type, etc.). In an example scenario involving a semiconductor sensing type of fingerprint sensor, the various examples presented herein are not limited to any particular type of such sensing (e.g., utilizing a temperature and/or pressure sensor, utilizing a capacitance sensor, etc.). Further, it should be understood that the examples presented herein may apply to a so-called single sensing device or technique, in which the entire fingerprint is sensed at one time, and to a so-called continuous sensing device or technique, in which partially scanned fingerprints are continuously (or serially) sensed.

Various aspects of the present disclosure provide a fingerprint sensor device (or package), and a manufacturing method thereof, which can enhance planarity of a sensing region of a substrate in the fingerprint sensor package, thereby increasing a fingerprint recognition rate and improving product quality.

In accordance with various aspects of the present disclosure, a fingerprint sensor device (or package) is provided, for example comprising: a substrate, a semiconductor die connected to the substrate, and interconnection structures (e.g., conductive ball, bumps, posts, etc.) connected to the substrate, wherein the substrate includes a dielectric layer having a first surface and a second surface, a plurality of first wiring patterns formed on or in the first surface of the dielectric layer and spaced apart from each other, and a second dielectric (or passivation) layer covering the first surface of the dielectric layer, wherein the first wiring patterns are embedded in the first surface of the dielectric layer, for example extending from the first surface to inside of the dielectric layer.

In accordance with various aspects of the present disclosure, a method of manufacturing a fingerprint sensor device (or package), or a portion thereof (e.g., a substrate, etc.) is provided. The example method may, for example, comprise preparing a first conductive layer, forming a plurality of first wiring patterns spaced apart from each other by patterning the first conductive layer, forming a dielectric layer to cover the first wiring patterns, and forming a second dielectric layer to cover the first wiring patterns and the dielectric layer, wherein the first wiring patterns are embedded in the first surface of the dielectric layer.

Various aspects of the present disclosure provide a fingerprint sensor device (or package), and method of manufacturing thereof, comprising: a substrate comprising a first substrate side, a second substrate side opposite the first substrate side, and a lateral substrate side extending between the first and second substrate sides; a semiconductor die coupled to the second substrate side; and a conductive interconnection structure coupled to the second substrate side and laterally offset from the semiconductor die, wherein the substrate comprises: a first dielectric layer (DL) comprising a first DL side facing away from the semiconductor die and a second DL side facing toward the semiconductor die; a first wiring pattern embedded within the first dielectric layer and having a first side exposed at the first side of the first dielectric layer; and a second dielectric layer covering the first side of the first dielectric layer and the first side of the first wiring pattern.

Various aspects of the present disclosure also provide a fingerprint sensor (or package), and method of manufacturing thereof, comprising: a substrate comprising a first substrate side and a second substrate side opposite the first substrate side; a semiconductor die coupled to the second substrate side; a conductive interconnection structure coupled to the second substrate side and laterally offset from the semiconductor die; and a flexible printed circuit (FPC) comprising a first FPC side coupled to the conductive interconnection structure and a second FPC side opposite the first FPC side, wherein the substrate comprises: a first dielectric layer (DL) comprising a first DL side facing away from the semiconductor die and a second DL side opposite the first DL side; a first wiring pattern at the first DL side; and a second dielectric layer covering the first DL side and the first wiring pattern.

Various aspects of the present disclosure also provide a fingerprint sensor (or package), and method of manufacturing thereof, comprising a substrate that comprises: a first dielectric layer (DL) comprising a first DL side and a second DL side opposite the first DL side; a first wiring pattern, at least a portion of which is configured to sense a fingerprint, embedded within the first DL side, and comprising a first side exposed at the first DL side; a second dielectric layer covering the first side of the first dielectric layer and the first side of the first wiring pattern; and a second wiring pattern, at least a portion of which is configured for attachment to a semiconductor die, on the second DL side.

As described herein, in an example fingerprint sensor package, and an example method of manufacturing thereof, the planarity of a sensing region of a substrate in the fingerprint sensor package can be enhanced, thereby increasing a fingerprint recognition rate and improving product quality.

The above and other aspects of the present disclosure will be described in or be apparent from the following description of various example implementations. Various aspects of the present disclosure will now be presented with reference to accompanying drawings.

Note that although the examples provided herein are generally presented in the context of forming of a single fingerprint sensor device, this is for illustrative clarity only. In an example implementation, a plurality of such devices may be formed in a panel or wafer form, wherein singulation is performed at the appropriate point in the process, after which additional processes may be performed at the single-device level.

FIG. 1 shows a flow diagram of an example method 1000 of making a sensor device (e.g., a fingerprint sensor device), in accordance with various aspects of the present disclosure. The example method 1000 may, for example, share any or all characteristics with any other method discussed herein (e.g., the example method 3000 of FIG. 3, etc.). FIGS. 2A-2I show cross-sectional views illustrating example sensor devices and example methods of making a sensor device, in accordance with various aspects of the present disclosure. The structures shown in 2A-2I may share any or all characteristics with analogous structures shown in FIGS. 4A-4B, etc. FIGS. 2A-2I may, for example, illustrate an example sensor device (e.g., a fingerprint sensor device) at various stages (or blocks) of the example method 1000 of FIG. 1. FIGS. 1 and 2A-2I will now be discussed together. It should be noted that the order of the example blocks of the example method 1000 may vary, various blocks may be omitted, and/or various blocks may be added without departing from the scope of this disclosure.

At a high level, the example method 1000 may comprise forming a first conductive layer (block 1010), forming a first wiring pattern (block 1020), forming a first dielectric layer (block 1030), forming a via hole (block 1040), forming a conductive via and a second conductive layer (block 1050), forming a second wiring pattern (block 1060), removing the carrier (1070), forming second and third dielectric layers (block 1080), forming a coating (block 1090), and performing additional manufacturing processes.

The example method 1000 may begin executing at block 1005. The example method 1000 may begin executing in response to any of a variety of causes or conditions, non-limiting examples of which are provided herein. For example, the example method 1000 may begin executing in response to receiving a process flow from another block of the example method 1000 or another method (e.g., the example method 3000 of FIG. 3, or any block thereof, etc.). Also for example, the example method 1000 may begin executing in response to the arrival of materials utilized by the method 1000, in response to the availability of processes or equipment utilized by the method 1000, etc. Additionally, for example, the example method 1000 may begin executing in response to a user and/or automated command to begin (e.g., from a process controller, safety system, etc.). In general, the example method 1000 may begin executing in response to any of a variety of causes or conditions. Accordingly, the scope of this disclosure is not limited by characteristics of any particular examples provided herein.

The example method 1000 may, at block 1010, comprise forming a first conductive layer (e.g., on a carrier, etc.). Block 1010 may comprise forming a first conductive layer in any of a variety of manners, non-limiting examples of which are provided herein.

Block 1010 may, for example, comprise forming a conductive layer on a carrier (or base) (e.g., a carrier, a fully removable carrier, a partially removable carrier, etc.). Such a conductive layer may, for example, be formed on a single side (or major surface) of the carrier or on two sides (e.g., opposing major surfaces) of the carrier. Though processing on both sides of the carrier need not be performed, in various example implementations, manufacturing efficiency or productivity may be gained by such an implementation. Many of the illustrations presented herein show an example dual-side implementation. In such cases, the description herein will generally focus on only one side, and it will be understood that the description also applies to the second side. Note also that in such cases, any or all of the operations may be performed simultaneously on both sides (e.g., layer forming, layer patterning, etc.).

The carrier may comprise a plate (e.g., a sheet, panel, wafer, pane, etc.) of any of a variety of materials. For example, the carrier may comprise glass, stainless steel, semiconductor material (e.g., silicon, etc.), any of the variety of dielectric materials presented herein, etc.

The first conductive layer may comprise one or more layer of any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. The first conductive layer may be formed or deposited (e.g., on the carrier) utilizing any one or more of a variety of processes (e.g., electrolytic plating, electroless plating, chemical vapor deposition (CVD), sputtering or physical vapor deposition (PVD), plasma vapor deposition, printing, screen printing, lithography, etc.), but the scope of the present disclosure is not limited thereto. Note that in various example implementations, for example an implementation including electroplating, a seed layer may be formed on the carrier prior to the plating process.

Figure 2A:
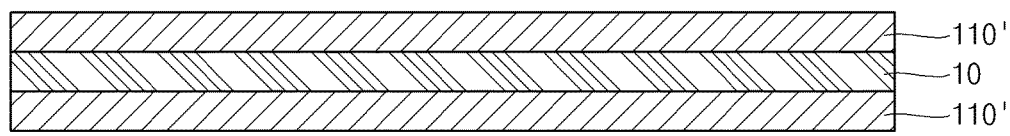
FIGS. 2A-2I show cross-sectional views illustrating example sensor devices and example methods of making a sensor device, in accordance with various aspects of the present disclosure.

An example implementation 200A showing various aspects of block 1010 is shown at FIG. 2A. The example implementation 200A (or assembly, sub-assembly, package, etc.) comprises a carrier 10, on which a conductive layer 110' has been applied to top and bottom sides of the carrier 10. In the example implementation 200A, the surface of the example conductive layer 110' facing the carrier 10 is planar, and the surface of the example conductive layer 110' facing away from the carrier 10 is also planar.

In general, block 1010 may comprise forming a first conductive layer (e.g., on a carrier, etc.). Accordingly, the scope of this disclosure should not be limited by characteristics of any particular type of conductive layer or any particular manner of forming such a conductive layer.

The example method 1000 may, at block 1020, comprise forming a first wiring pattern. Block 1020 may comprise forming a first wiring pattern in any of a variety of manners, non-limiting examples of which are provided herein.

The first wiring pattern may comprise any of variety of characteristics. For example, the first wiring pattern may be formed in or comprise a fingerprint sensing pattern that is configured to sense fingerprints. In an example implementation, the first wiring pattern may be formed in a pattern used to capture a fingerprint by sensing one or more of a variety of electrical characteristics (e.g., capacitance, voltage, current, resistance, etc.) while a finger is swiped across (or placed over) the first wiring pattern. For example, the first wiring pattern may comprise a plurality of parallel and non-parallel traces spaced apart by respective gaps (or spaces), which may have constant or varying width along respective traces. For example, the first wiring pattern may comprise many adjacent conductive traces (or pads or other features) spaced apart with respective intervening gaps. At this point, such gaps (or spaces) may be empty.

Block 1020 may, for example, comprise forming the first wiring pattern by removing selected portions of the first conductive layer formed at block 1010. Such removing may, for example, be performed utilizing chemical and/or mechanical removal techniques (e.g., photolithographic etching, laser or mechanical ablation, etc.). Note that blocks 1020 and 1010 may be combined in example implementations in which the first conductive layer is originally formed (e.g., printed or otherwise deposited) with the first wiring pattern.

Figure 2B:
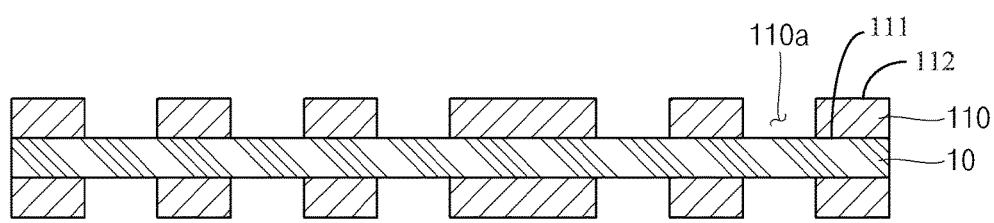
Figure 2B:
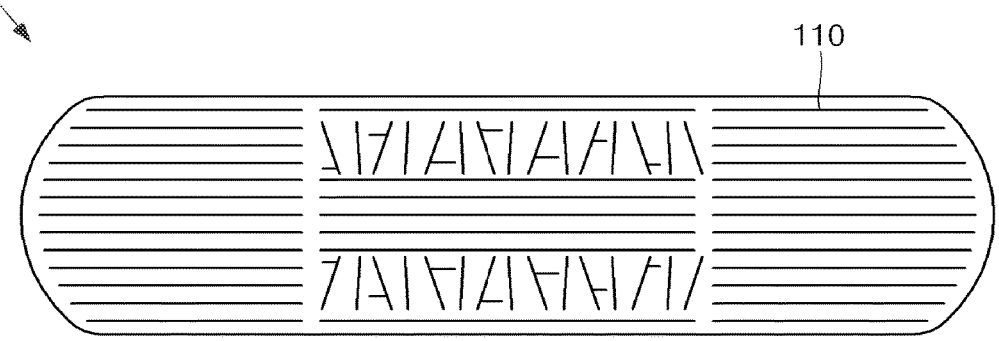

An example implementation 200B showing various aspects of block 1020 is shown at FIG. 2B. FIG. 2B shows a cross-sectional view of the example implementation 200B, which is labeled 200B-1, and a plan view of the example implementation 200B, which his labeled 200B-2. The example implementation 200B (or assembly, sub-assembly, package, etc.) comprises a first wiring pattern 110 on the carrier. The first wiring pattern 110 may, for example, comprise a first surface 111 that faces and/or contacts the carrier 110, and a second surface 112 opposite the first surface 111 that faces away from the carrier 110. The first surface 111 of the first wiring pattern 110 may, for example, be planar and parallel to the surface of the carrier 10 on which the first wiring pattern 110 is formed. The second surface 112 of the first wiring pattern 110 may also, for example, be planar and/or parallel to the first surface 111.

As shown in the cross-sectional view 200B-1, adjacent traces (or other patterned conductive features, like pads, lands, etc.) of the wiring pattern 110 are separated by a gap (or space) 110a. Note that although the side walls of the first wiring pattern 110, for example defining the gap 110a, are shown as being flat and vertical, such a configuration is not necessary. For example, the side walls of the traces of the first wiring pattern may be concave and/or convex (e.g., depending on the manner, for example etching, in which the first wiring pattern 110 is formed).

As shown in the plan view 200B-2, the example first wiring pattern 110 comprises a plurality of conductive elements (e.g., traces, pads, lands, etc.). For example, some adjacent traces are parallel to each other, some adjacent traces are not parallel to each other, some adjacent traces are orthogonal to each other, etc.

In general, block 1020 may comprise forming a first wiring pattern. Accordingly, the scope of this disclosure should not be limited by characteristics of any particular type of wiring pattern (e.g., general wiring pattern, sensor wiring pattern, fingerprint sensing pattern, etc.) or any particular manner of forming such a wiring pattern.

The example method 1000 may, at block 1030, comprise forming a first dielectric layer. Block 1030 may comprise forming a first dielectric layer in any of a variety of manners, non-limiting examples of which are provided herein.

The first dielectric layer may, for example, cover the first wiring pattern formed at block 1020 and the carrier on which the first wiring pattern was formed. For example, the first dielectric layer may fill in the gaps between the traces (or portions) of the first wiring pattern. A surface of the first dielectric layer may thus contact the carrier, just as a surface of the first wiring pattern may contact the carrier. Such surfaces may thus be coplanar. Such coplanarity may, for example, enhance sensing accuracy, increase product reliability, etc.

The first dielectric layer (or portion thereof) that fills the gaps (or spaces) between the traces of the first wiring pattern also covers sides surfaces of such traces, providing protection for the first wiring pattern. Additionally, the first dielectric layer (or portion thereof) that fills the gaps provides reliable and consistent electrical isolation between portions of the first wiring pattern that are to be electrically isolated from each other.

The first dielectric layer may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. In an example implementation, the first dielectric layer may comprise a semi-cured film mold material, a prepreg material, and/or a build-up film.

The first dielectric layer may be formed using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

Figure 2C:
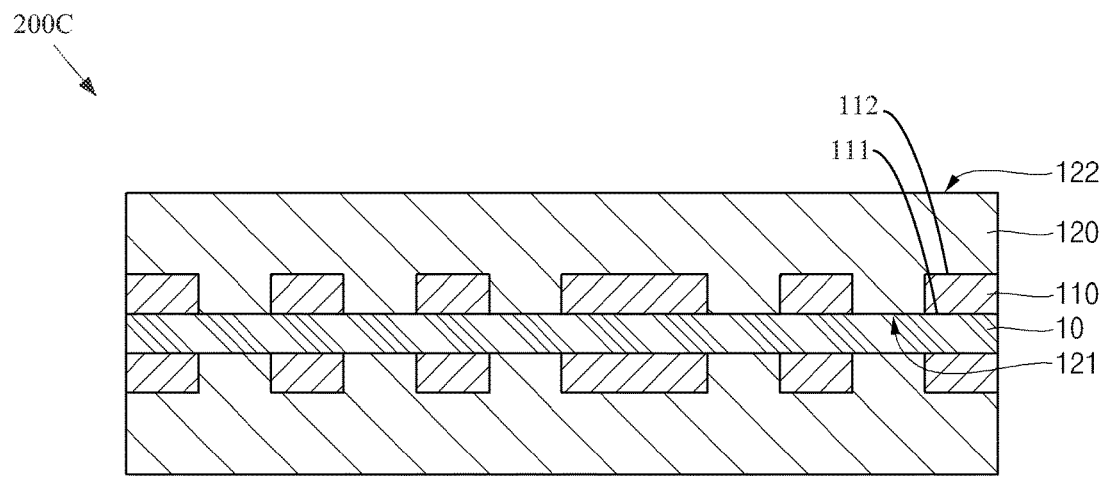

An example implementation 200C showing various aspects of block 1030 is shown at FIG. 2C. The example implementation 200C (or assembly, sub-assembly, package, etc.) comprises a first dielectric layer 120 formed on the first wiring pattern 110 and the carrier 10.

The example first dielectric layer 120 covers the first wiring pattern 110 and the carrier 10. For example, the first dielectric layer 120 fills in the gaps 110a between the traces (or portions or features) of the first wiring pattern 110. A first surface 121 of the first dielectric layer 120 contacts the carrier 10, just as a first surface 111 of the first wiring pattern 110 contacts the carrier 10. Such surfaces 121 and 111 may thus be coplanar.

The first dielectric layer 120 (or portion thereof) that fills the gaps 110a (or spaces) between the traces (or portions or features) of the first wiring pattern 110 also covers sides surfaces of such traces, providing protection for the first wiring pattern 110. Additionally, the first dielectric layer 120 (or portion thereof) that fills the gaps 110a provides reliable and consistent electrical isolation between portions of the first wiring pattern 110 that are to be electrically isolated from each other.

The example first dielectric layer 120 is shown thicker than the example first wiring pattern 110, and thus covers the second surface 112 of the first wiring pattern 110. The first wiring pattern 110 thus extends into, but not completely through, the first dielectric layer 120. Viewed another way, the example first wiring pattern 110 is disposed within (or embedded in) trenches (or grooves) of the first dielectric layer 120. In another example implementation, the first dielectric layer 120 may have the same thickness as the first wiring pattern 110 (e.g., additional dielectric layers may be formed over the first dielectric layer 120).

In general, block 1030 may comprise forming a first dielectric layer. Accordingly, the scope of this disclosure should not be limited by characteristics of any particular type of dielectric layer or any particular manner of forming a dielectric layer.

The example method 1000 may, at block 1040, comprise forming a via hole. Block 1040 may comprise forming a via hole in any of a variety of manners, non-limiting examples of which are provided herein.

The via hole may, for example, extend from the second surface of the first dielectric layer to the second surface of the first wiring pattern (e.g., to a trace, pad, or other feature or portion of the first wiring pattern). The via hole may, for example, have sloped sides or vertical sides. As will be seen herein, an electrical connection may be formed through the via hole between a conductor above the first dielectric layer and the portion of the first wiring pattern exposed by the via hole.

Block 1040 may comprise forming the via hole by ablating (e.g., laser ablating, mechanical ablating or drilling, etc.) the via hole, chemically etching the via hole, etc. In another example implementation, the forming of the first dielectric layer at block 1030 and the forming of the via hole at block 1040 may be combined into a single block. For example, the first dielectric layer may be originally formed (e.g., molded, printed, deposited, etc.) to have the via hole.

Figure 2D:
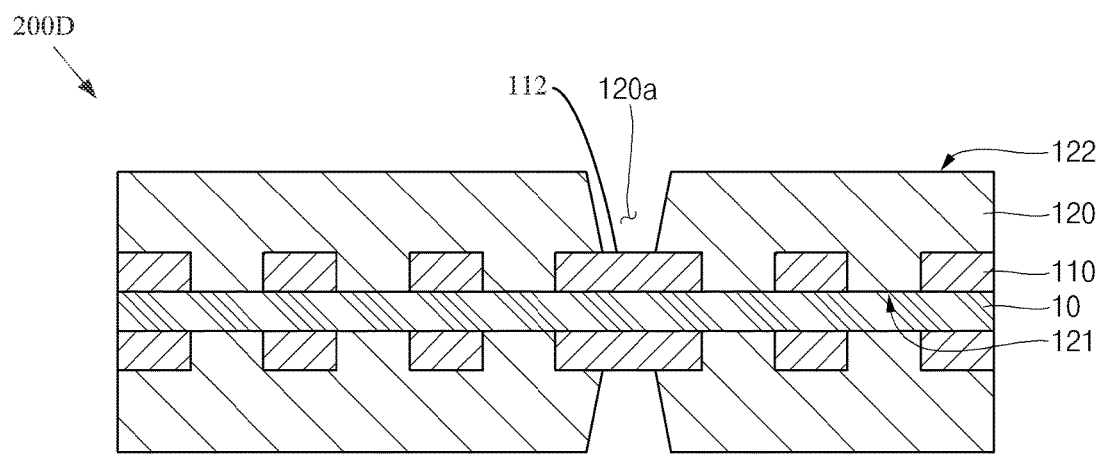

An example implementation 200D showing various aspects of block 1040 is shown at FIG. 2D. The example implementation 200D (or assembly, sub-assembly, package, etc.) comprises a via hole 120a that extends straight through the first dielectric layer 120 from the second surface 122 of the dielectric layer 120 to the second surface 112 of the first wiring pattern 110. Though the example via hole 120a is shown with sloped sidewalls, such sidewalls may also be vertical.

Note that although only one via hole is shown and discussed, this is for illustrative clarity. Any number of such via holes may be formed.

In general, block 1040 may comprise forming a via hole. Accordingly, the scope of this disclosure should not be limited by characteristics of any particular type of via hole or any particular manner of forming such a via hole.

The example method 1000 may, at block 1050, comprise forming a conductive via and a second conductive layer. Block 1050 may comprise forming a first conductive via and a second conductive layer in any of a variety of manners, non-limiting examples of which are provided herein.

The via hole formed at block 1040 may, for example, be fully or partially filled with conductive material. In an example implementation, the inner surfaces of the first dielectric layer bounding the via hole may be covered with a conductive material, and the second conductive layer may be formed on the second surface of the first dielectric layer. The second conductive layer (and/or second wiring patterned formed therefrom at block 1060) may, for example, be electrically connected to the first wiring pattern formed at block 1020 through the conductive via.

The conductive via and/or the second conductive layer may comprise one or more layer of any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. The conductive via may also, for example, comprise a solder material (e.g., tin, silver, antimony, copper, nickel, lead, combinations thereof, alloys thereof, equivalents thereof, etc.). Though the conductive via and/or the second conductive layer are presented here as formed from a same material, they may be formed of different respective materials. For example, the conductive via may be formed of a solder material, and the second conductive layer may be formed of plated copper. Note that the conductive via and/or second conductive layer may be formed of a same material as that of the first conductive layer.

The conductive via and/or the second conductive layer may be formed or deposited (e.g., on the carrier) utilizing any one or more of a variety of processes (e.g., electrolytic plating, electroless plating, chemical vapor deposition (CVD), sputtering or physical vapor deposition (PVD), plasma vapor deposition, printing, screen printing, lithography, etc.), but the scope of the present disclosure is not limited thereto. Note that in various example implementations, for example an implementation including electroplating, a seed layer may be formed in the via hole and/or on the second surface of the first dielectric layer prior to the plating process. The conductive via may also, for example, be formed using a solder reflow process. Though the conductive via and/or the second conductive layer are presented here as formed in a same process, they may be formed in different respective processes. For example, the conductive via may be formed by reflowing solder, and the second conductive layer may be formed by plating metal. Note that the conductive via and/or second conductive layer may be formed using a same type of process as that used to form the first conductive layer at block 1010.

Figure 2E:
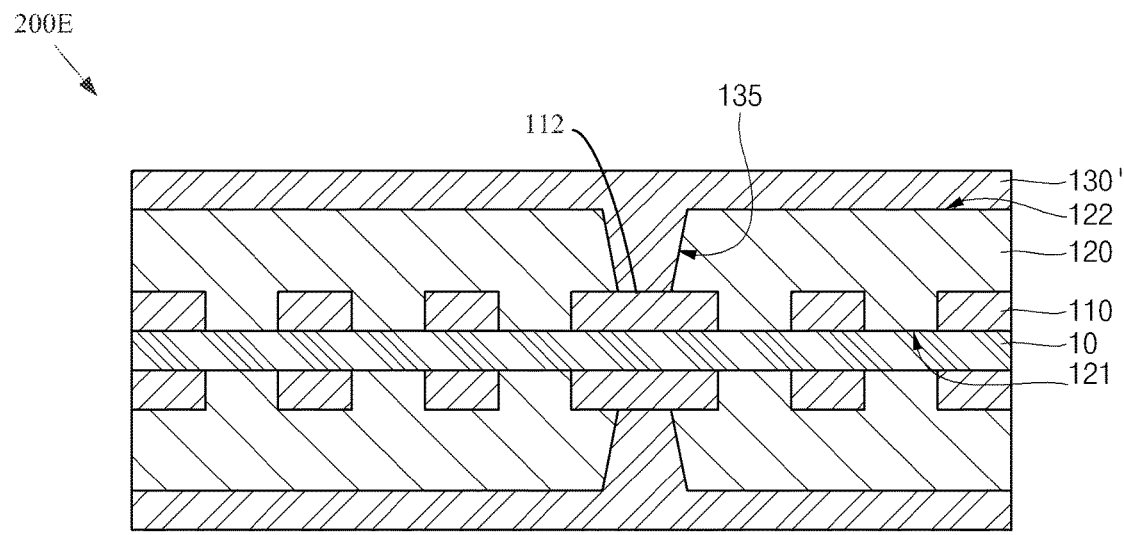

An example implementation 200E showing various aspects of block 1050 is shown at FIG. 2E. The example implementation 200E (or assembly, sub-assembly, package, etc.) comprises a conductive via 135 formed in the via hole 120*a*, and a second conductive layer 130' formed on the conductive via 135 and on the second surface 122 of the first dielectric layer 120. The conductive via 135 extends between the second conductive layer 130' and the second surface 112 of the first wiring pattern 110, thus provided an electrical connection between the first wiring pattern 110 and the second conductive layer 130' (or second wiring pattern formed therefrom at block 1060). Though the conductive via 135 is shown completely filling the via hole 120*a*, such complete filling is not necessary. Note that although the example shown and discussed herein shows only two conductive layers electrically connected by a conductive via, such example is for illustrative clarity. Note that any number of conductive and dielectric layers may be formed, and although a single via may extend directly through any or all of such layers, this need not be the case.

Note that, in contrast to the example first wiring pattern 110, the example second conductive layer 130' is not embedded in the first dielectric layer 120. Rather, the second conductive layer 130' is formed on the second surface 122 of the first dielectric layer 120. In another example implementation, grooves (or trenches) may be formed in the first dielectric layer 120, and the second conductive layer 130' may be at least partially formed in such grooves. For example, the grooves may be formed to match the desired second wiring pattern discussed herein.

In general, block 1050 may comprise forming a conductive via and a second conductive layer. Accordingly, the scope of this disclosure should not be limited by characteristics of any particular type of conductive layer or any particular manner of forming such a conductive layer.

The example method 1000 may, at block 1060, comprise forming a second wiring pattern. Block 1060 may comprise forming a first second wiring pattern in any of a variety of manners, non-limiting examples of which are provided herein.

The second wiring pattern may comprise any of variety of characteristics. For example, in an example implementation a first portion of the second wiring pattern may comprise conductive structures (e.g., pads, lands, traces, etc.) configured (e.g., sized, spaced, etc.) for connection to one or more electronic components (e.g., semiconductor die, etc.). A second portion of the second wiring pattern may comprise conductive structures (e.g., pads, lands, traces, etc.) configured (e.g., sized, spaced, etc.) for connection to one or more conductive interconnection structures (e.g., conductive balls or bumps, solder balls or bumps, metal posts or pillars, leads, etc.).

In an example implementation, a first portion of the traces or portions (or other conductive features, as discussed herein) of the second wiring pattern are electrically connected through respective conductive vias through the first dielectric layer (e.g., as formed at block 1050) to respective traces or patterns (or other conductive features) of the first wiring pattern (e.g., as formed at block 1020). For example, an input and/or output signal line of an electronic device (e.g., attached later) may be connected to the second wiring pattern, and thus also electrically connected to a trace or pattern of the first wiring pattern through a conductive via. In an example implementation, each electrically isolated trace or pattern of the first wiring pattern 110 may be electrically coupled through at least one respective via to a respective trace or pattern of the second wiring pattern.

In an example implementation, a second portion of the traces or patterns of the second wiring pattern may, for example, be signal distribution lines electrically connecting some of the conductive structures (e.g., pads, etc.) configured for electronic component attachment to conductive structures configured for the conductive interconnection structures. For example, an input and/or output signal line of an electronic device (e.g., attached later) may be connected to the second wiring pattern and thus also electrically connected to a conductive interconnection structure (e.g., attached later), for example a conductive ball or bump, etc.

As with the first wiring pattern, the second wiring pattern may comprise a plurality of parallel and non-parallel traces spaced apart by respective gaps (or spaces), the widths of which may be constant or varying along respective traces. For example, the second wiring pattern may comprise many adjacent conductive traces (or pads or other features) spaced apart with respective intervening gaps. At this point, such gaps (or spaces) may be empty.

Block 1060 may, for example, comprise forming the second wiring pattern by removing selected portions of the second conductive layer formed at block 1050. Such removing may, for example, be performed utilizing chemical and/or mechanical removal techniques (e.g., photolithographic etching, laser or mechanical ablation, etc.). Note that blocks 1060 and 1050 may be combined in example implementations in which the second conductive layer is originally formed (e.g., printed or otherwise deposited) with the second wiring pattern. Block 1060 may, for example, be performed in a same manner as block 1020.

Figure 2F:
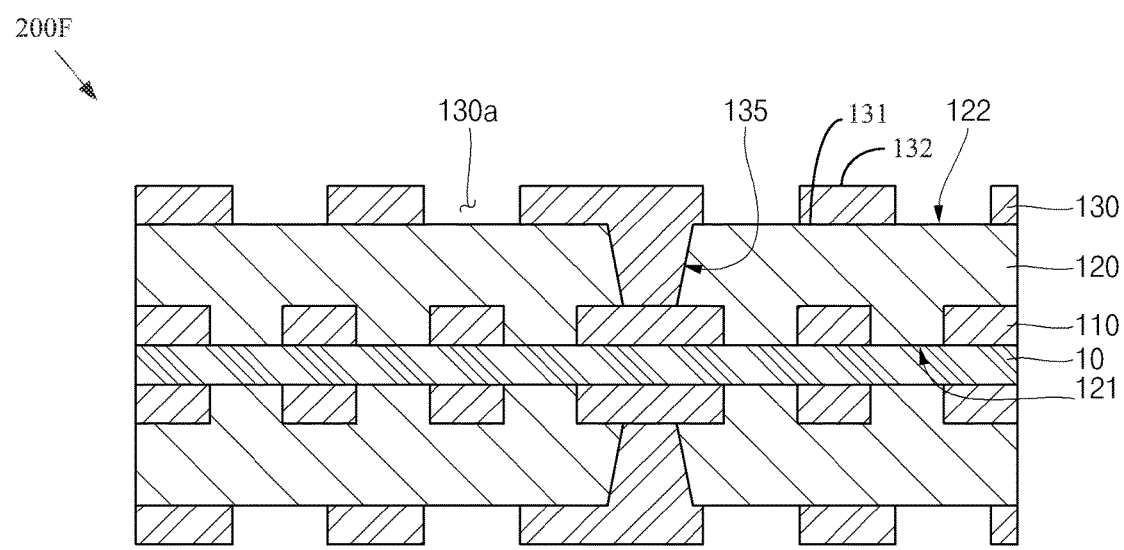

An example implementation 200F showing various aspects of block 1060 is shown at FIG. 2F. The example implementation 200F (or assembly, sub-assembly, package, etc.) comprises a second wiring pattern 130 on the second surface 122 of the first dielectric layer 120. The second wiring pattern 130 may, for example, comprise a first surface 131 that faces and/or contacts the first dielectric layer 120, and a second surface 132 opposite the first surface 131 that faces away from the first dielectric layer 120. The second wiring pattern 130 may, for example, extend outward from the second surface 122 of the first dielectric layer 120. For example, instead of being embedded in the first dielectric layer 120 like the first wiring pattern 110, the second wiring pattern 120 might not extend into the first dielectric layer 120.

The first surface 131 of the second wiring pattern 130 may, for example, be planar and parallel to the second surface 122 of the first dielectric layer 120 on which the second wiring pattern 130 is formed. The second surface 132 of the second wiring pattern 130 may also, for example, be planar and/or parallel to the first surface 131.

As shown in the cross-sectional view of FIG. 2F, adjacent traces (or other patterned conductive features, like pads, lands, etc.) are separated by a gap (or space) 130a. Note that although the side walls of the second wiring pattern 130, for example defining the gap 130a, are shown as being flat and vertical, such a configuration is not necessary. For example, the side walls of the traces of the first wiring pattern may be concave and/or convex (e.g., depending on the manner, for example etching, in which the second wiring pattern 130 is formed).

In general, block 1060 may comprise forming a second wiring pattern. Accordingly, the scope of this disclosure should not be limited by characteristics of any particular type of wiring pattern or any particular manner of forming a wiring pattern.

The example method 1000 may, at block 1070, comprise removing the carrier. Block 1070 may comprise removing the carrier in any of a variety of manners, non-limiting examples of which are provided herein.

For example, block 1070 may comprise pulling, peeling, or shearing the carrier from the assembly(s) formed thus far. Also, for example, block 1070 may comprise applying heat to remove a thermally-releasable carrier. Additionally, for example in a scenario in which the assembly is only formed on one side of the carrier (or in which a second assembly has already been removed from a second side of the carrier), block 1070 may comprise mechanically grinding and/or chemically etching the carrier. Further, for example, block 1070 may comprise dissolving the carrier.

Figure 2G:
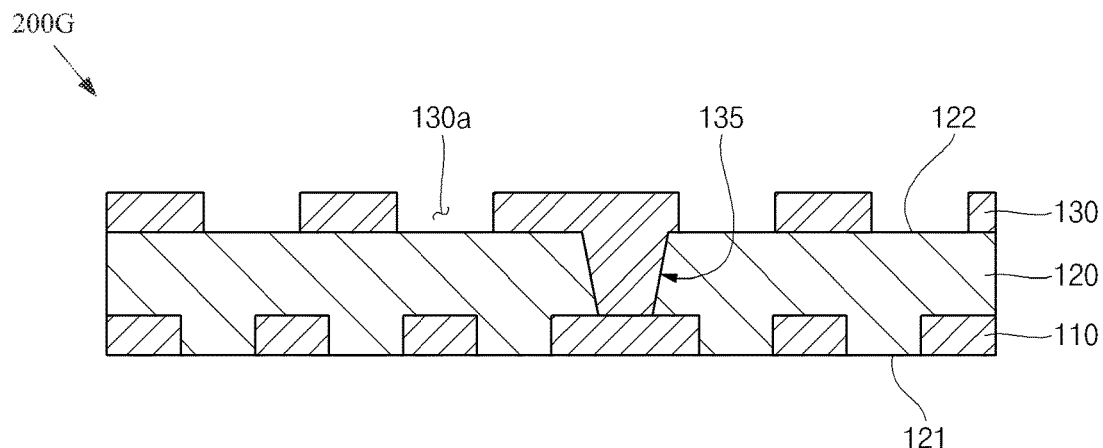

An example implementation 200G showing various aspects of block 1070 is shown at FIG. 2G. The example implementation 200G (or assembly, sub-assembly, package, etc.), compared to the example implementation 200F, represents the top portion of the implementation 200F with the carrier 10 removed. For example, the example implementation 200F, which included the formation of two substrate assemblies (e.g., one above the carrier 10 and one below the carrier 10), yields two of the example implementations 200G shown in FIG. 2G.

In general, block 1070 may comprise removing the carrier. Accordingly, the scope of this disclosure should not be limited by characteristics of any particular type of carrier or any particular manner of forming a carrier.

The example method 1000 may, at block 1080, comprise forming second and/or third dielectric layers. Block 1080 may comprise forming second and/or third dielectric layers in any of a variety of manners, non-limiting examples of which are provided herein.

The second dielectric layer (which may also be referred to as a passivation layer) may, for example, cover (and protect) the first wiring pattern. For example, the second dielectric layer may be formed on the first surface of the first wiring pattern and the first surface of the first dielectric layer. For example, as explained herein, in an example implementation, the first surface of the first wiring pattern may be coplanar with the first surface of the first dielectric layer. In such an example implementation, a surface of the second dielectric layer that faces and covers the first wiring pattern and the first dielectric layer may also be planar, and parallel with the first surface of the first wiring pattern and with the first surface of the first dielectric layer. The second surface of the second dielectric layer may, for example, be planar and parallel to the first surface of the second dielectric layer and separated from the first surface of the second dielectric layer by a generally constant thickness.

The third dielectric layer (which may also be referred to as a passivation layer) may, for example, cover (and protect) the second wiring pattern (or a portion thereof). For example, the third dielectric layer may be formed on the second surface of the first dielectric layer and at least in the gaps (or spaces) between traces (or other conductive features) of the second wiring pattern. In an example implementation, the second surface of the second wiring pattern may be exposed from (or not covered by) the third dielectric layer. For example, a surface of the third dielectric layer facing the second surface of the first dielectric layer may be generally planar and parallel to the second surface of the first dielectric layer, and the second surface of the second wiring pattern and a surface of the third dielectric layer facing away from the first dielectric layer may be coplanar. In another example implementation, the third dielectric layer may also cover at least a portion of the second surface of the second wiring pattern (e.g., including apertures through which the second wiring pattern may be accessed). For example, the third dielectric layer may be formed to expose only a portion of the second wiring pattern (e.g., to which additional connections are to be made). The second surface of the third dielectric layer may, for example, be planar and parallel to the first surface of the third dielectric layer and separated from the first surface of the third dielectric layer by a generally constant thickness. The second and third dielectric layers may be a same thickness, but this need not be the case.

The third dielectric layer (or portion thereof) that fills the gaps (or spaces) between the traces of the second wiring pattern also covers sides surfaces of such traces, providing protection for the second wiring pattern. Additionally, the third dielectric layer (or portion thereof) that fills such gaps provides reliable and consistent electrical isolation between portions of the second wiring pattern (and/or components, which may eventually be attached thereto) that are to be electrically isolated from each other.

The second and/or third dielectric layers may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto. In an example implementation, the second and/or third dielectric layers may each comprise a semi-cured film mold material, a prepreg material, and/or a build-up film. The second and/or third dielectric layers may, for example, be formed of a same material, but may also be formed of different respective materials. For example, the second dielectric layer may be selected to optimize general flatness and thinness and/or the transmission of signals to and/or from the first wiring pattern and a finger, and the third dielectric layer may be selected to optimize gap-filling and/or stability. Note that either of the second and/or third dielectric layers may be formed of a same material as the first dielectric layer or may be formed of different materials.

The second/or third dielectric layers may be formed using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto. The second and/or third dielectric layers may, for example, be formed with a same process, but may also be formed utilizing different respective processes. For example, the second dielectric layer may be formed utilizing a process that is optimized to achieve general flatness and thinness and/or the transmission of signals to and/or from the first wiring pattern and a finger, and the third dielectric layer may be formed utilizing a process that is optimized for gap-filling and/or stability. Note that either of the second and/or third dielectric layers may be formed utilizing a same process as the first dielectric layer or may be formed utilizing a different process.

Figure 2H:
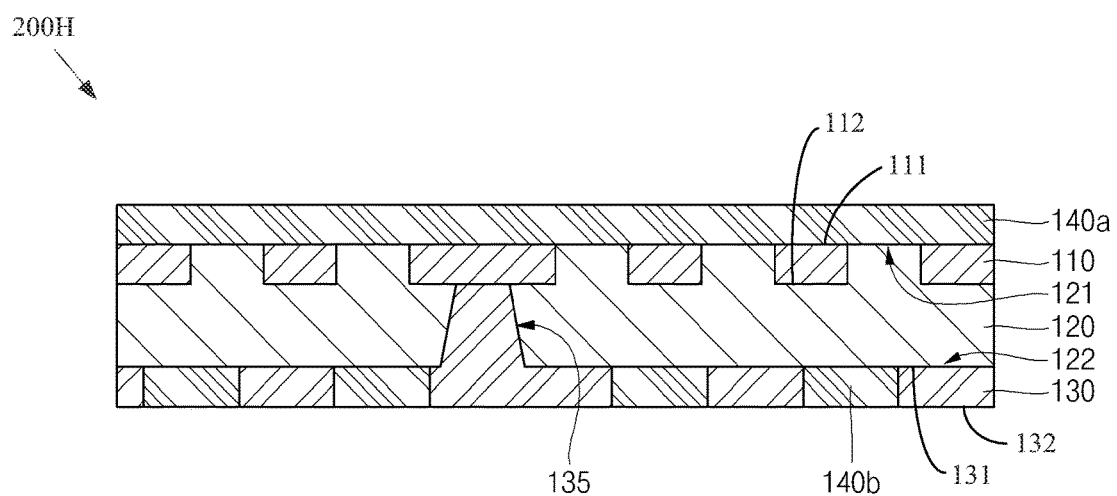

An example implementation 200H showing various aspects of block 1080 is shown at FIG. 2H. Note that the example implementation 200H is inverted relative to the example implementation 200G. The example implementation 200H (or assembly, sub-assembly, package, etc.) comprises a second dielectric layer 140a on (and covering) the first surface 111 of the first wiring pattern 110, and on (and covering) the first surface 121 of the first dielectric layer 120. The example implementation 200H also comprises a third dielectric layer 140b that is formed in the gaps between traces (or other features) of the second wiring pattern 130. The third dielectric layer 140b has an outer surface that is generally coplanar with the second surface 132 of the second wiring pattern 130, and an inner surface facing the second surface 122 of the first dielectric layer 130, which is generally planar and parallel to the second surface 122 of the first dielectric layer 130. Although not shown, some portion of the second wiring pattern 130 may be covered by the third dielectric layer 140b, for example, including apertures through which particular trace portions (e.g., pads, lands, etc.) may be accessed (e.g., for connecting with electronic components, interconnection structures, etc.).

In general, block 1080 may comprise forming second and/or third dielectric layers. Accordingly, the scope of this disclosure should not be limited by characteristics of any particular type of dielectric layer or any particular manner of forming a dielectric layer.

The example method 1000 may, at block 1090, comprise forming a coating. Block 1090 may comprise forming a coating in any of a variety of manners, non-limiting examples of which are provided herein.

The coating may, for example, be formed to cover the second dielectric layer formed at block 1080. In an example scenario in which the second dielectric layer is not formed, the coating may be formed directly on the first wiring pattern and the first surface of the first dielectric layer. For example, formation of the second dielectric layer may be skipped. The coating may, for example, comprise inner and/or outer planar surfaces. For example, the surface of the coating formed on the second dielectric layer may be planar, and the surface of the coating that is exposed to the outside, and which may contact a finger being sensed, may also be planar.

In an example fingerprint sensor implementation, the outer surface of the coating is the surface with which finger contact is made. For example, the outer surface of the coating is exposed to the outside of the fingerprint sensor device (or substrate thereof). The coating may, for example, protect the entire assembly from finger contact and from the external environment.

The coating may comprise any of a variety of materials. For example, the coating may comprise a hard coating liquid. The coating may, for example, comprise any one or more of an acryl resin, epoxy resin, silicon resin, ultraviolet (UV) curing resin, polyurethane resin, polymeric resin, photopolymerizable resin, and high molecular weight polymer, but aspects of the present invention are not limited thereto. In an example implementation, the coating may also comprise a glass or crystal plate, a display screen, etc.

The coating may be formed using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto. In an example implementation, the coating may be formed by attaching (e.g., adhering) the assembly to a glass or crystal place, a display screen, etc.

Figure 2I:
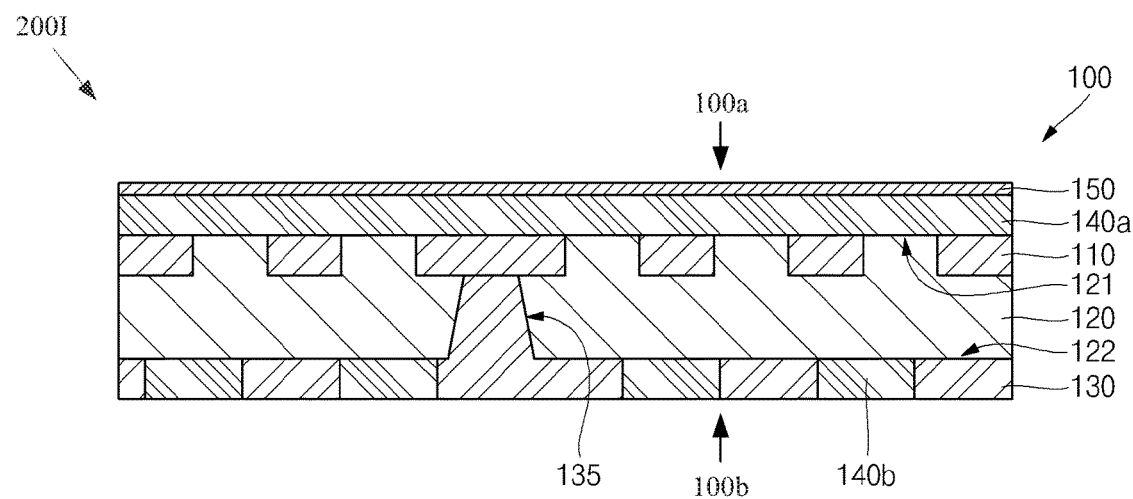

An example implementation 200I showing various aspects of block 1090 is shown at FIG. 2I. The example implementation 200I (or assembly, sub-assembly, package, etc.) comprises a coating 150 formed on (and covering) the second dielectric layer 140a.

In general, block 1090 may comprise forming a coating. Accordingly, the scope of this disclosure should not be limited by characteristics of any particular type of coating or any particular manner of forming such a coating.

The example method 1000 may, at block 1095, comprise continuing the manufacturing (or processing), if necessary. Block 1095 may comprise continuing the manufacturing in any of a variety of methods, non-limiting examples of which are provided herein.

For example, block 1095 may comprise performing any of a variety of additional processing steps. For example, block 1095 may comprise performing additional substrate processing steps, mounting electronic components to the substrate, attaching device interconnection structures to the substrate, encapsulating, covering, general packaging, testing, marking, shipping, etc. Also for example, block 1095 may comprise directing execution flow of the example method 1000 to any previous step of the example method 1000. Additionally for example, block 1095 may comprise directing execution flow of the example method 1000 to any other method disclosed herein (e.g., the example method 3000 of FIG. 3, or any portion thereof, etc.). Further for example, block 1095 may comprise directing execution flow of the example method 1000 to any method, or portion thereof, that is not disclosed herein.

In general, block 1095 may comprise continuing the manufacturing (or processing), if necessary. Thus, the scope of this disclosure should not be limited by characteristics of any particular manner or type of continued manufacturing (or processing).

Figure 3:
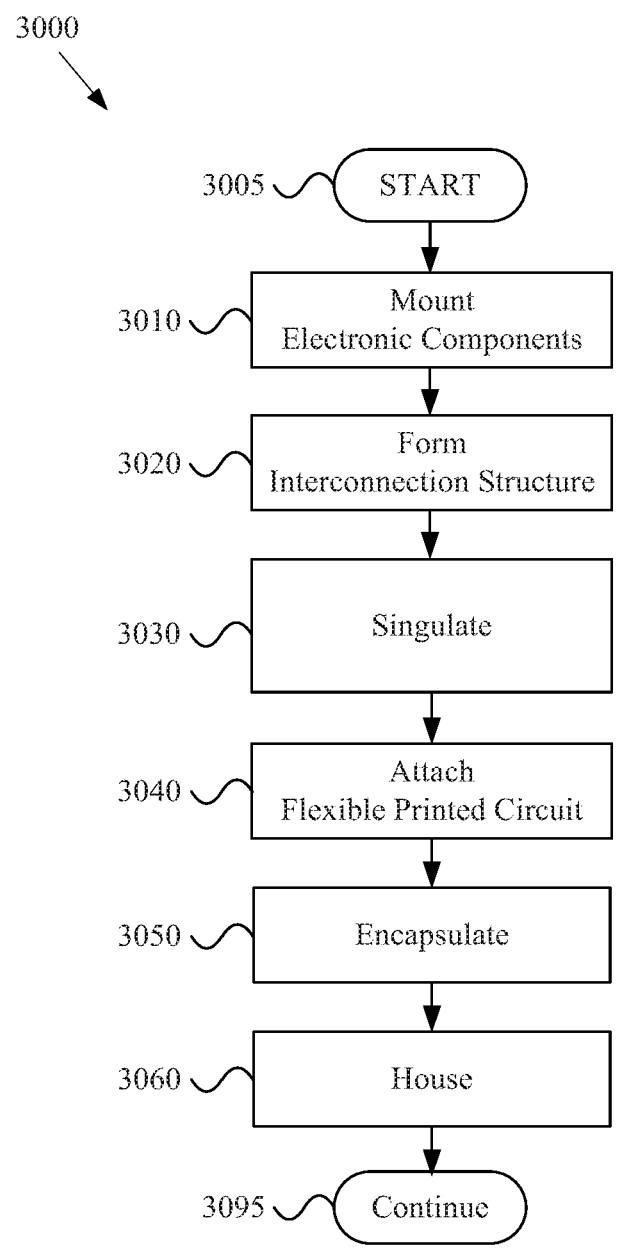
FIG. 3 shows a flow diagram of an example method of making a sensor device, in accordance with various aspects of the present disclosure.
Figure 4A:
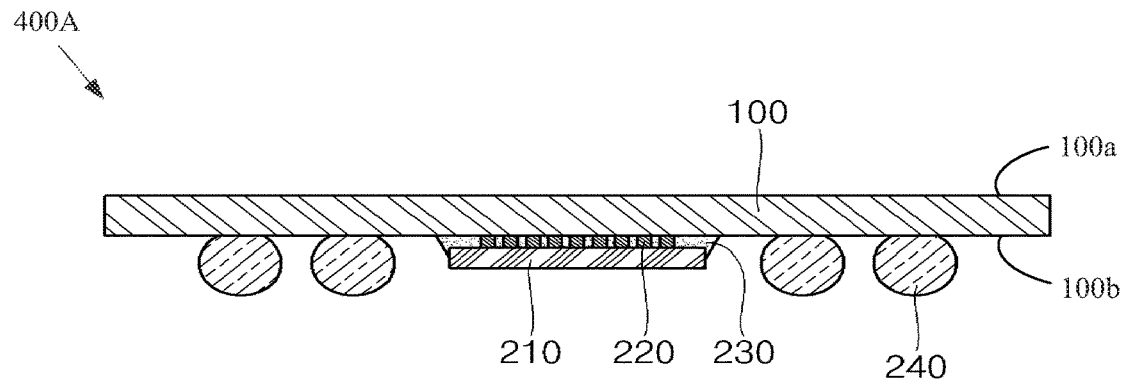
FIGS. 4A-4B show cross-sectional views illustrating example sensor devices and example methods of making a sensor device, in accordance with various aspects of the present disclosure.
Figure 4B:
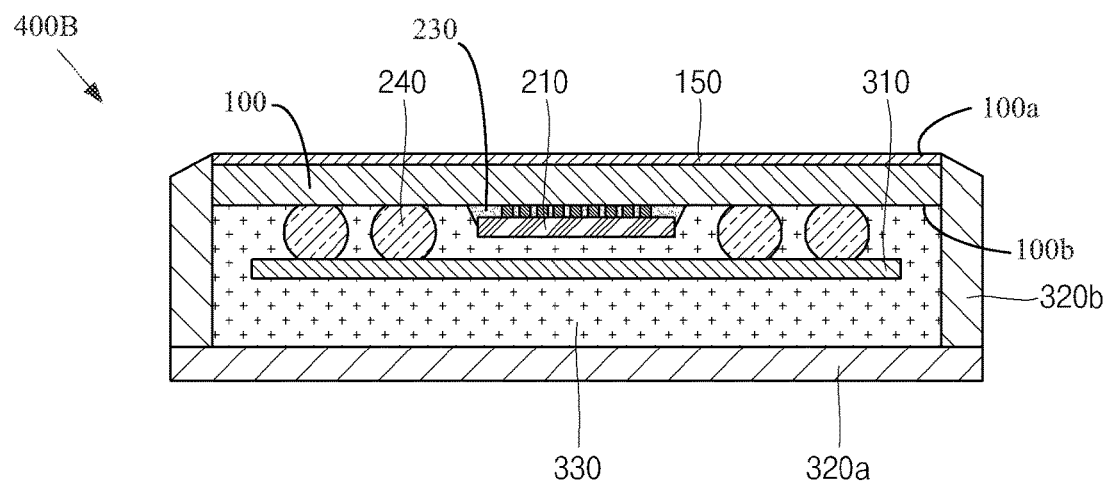

FIG. 3 shows a flow diagram of an example method of making a sensor device (e.g., a fingerprint sensor device), in accordance with various aspects of the present disclosure. The example method 3000 may, for example, share any or all characteristics with any other method discussed herein (e.g., the example method 1000 of FIG. 1, etc.). FIGS. 4A-4B show cross-sectional views illustrating example electronic devices and example methods of making an electronic device, in accordance with various aspects of the present disclosure. The structures shown in 4A-4B may share any or all characteristics with analogous structures shown in FIGS. 2A-2I, etc. FIGS. 4A-4B may, for example, illustrate an example electronic device at various stages (or blocks) of the example method 3000 of FIG. 3. FIGS. 3 and 4A-4B will now be discussed together. It should be noted that the order of the example blocks of the example method 3000 may vary, various blocks may be omitted, and/or various blocks may be added without departing from the scope of this disclosure.

The example method 3000 may begin executing at block 3005. The example method 3000 may begin executing in response to any of a variety of causes or conditions, non-limiting examples of which are provided herein. For example, the example method 3000 may begin executing in response to receiving a process flow from another method (e.g., the example method 1000 of FIG. 1, or any block thereof, a method different from those disclosed herein, etc.). Also for example, the example method 3000 may begin executing in response to receiving method flow from any of the other blocks (or portions thereof) of the example method 3000. Also for example, the example method 3000 may begin executing in response to the arrival of materials utilized by the method 3000, in response to the availability of processes or equipment utilized by the method 3000, etc. Additionally, for example, the example method 3000 may begin executing in response to a user and/or automated command to begin (e.g., from a process controller, safety mechanism, etc.). In general, the example method 3000 may begin executing in response to any of a variety of causes or conditions. Accordingly, the scope of this disclosure is not limited by characteristics of any particular examples provided herein.

The example method 3000 may, at block 3010, comprise mounting one or more electronic components to a substrate, for example a substrate that is exactly like or resembles the substrate 100 formed by the method 1000 of FIG. 1 and discussed herein. Block 3010 may comprise mounting the one or more electronic components in any of a variety of manners, non-limiting examples of which are provided herein.

The one or more electronic components may, for example, comprise a semiconductor die. Such die may, for example, comprise a sensor controller or processor die. The die may, for example, comprise a microprocessor, microcontroller, general purpose processor, application-specific integrated circuit, programmable and/or discrete logic device, memory device, combination thereof, equivalent thereof, etc. The one or more electronic components may also, for example, comprise one or more passive electronic devices (e.g., resistors, capacitors, inductors, etc.).

Block 3010 may comprise mounting the electronic component(s) to the substrate utilizing any of a variety of interconnection structures (e.g., conductive balls or bumps, solder balls or bumps, metal posts or pillars, copper posts or pillars, solder-capped posts or pillars, solder paste, conductive adhesive, etc.). Block 3010 may comprise mounting the electronic component(s) to the substrate utilizing any of a variety of bonding techniques (e.g., thermocompression bonding, mass reflow, adhesive attachment, etc.).

Block 3010 may, for example, comprise forming an underfill between the mounted electronic component(s) and the substrate. The underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto. The underfill may be formed in any of a variety of manners (e.g., capillary underfilling, pre-applied underfilling of a liquid or paste or film, molded underfilling, etc.). Such underfill may comprise any of a variety of characteristics (e.g., capillary underfill, pre-applied underfill, molded underfill, etc.).

An example implementation 400A showing various aspects of block 3010 is shown at FIG. 4A. The example implementation 400A (or assembly, sub-assembly, package, etc.) comprises a substrate 100, a semiconductor die 210, interconnection structures 220, an underfill 230, and interconnection structures 240. The substrate 100 may, for example, comprise any or all characteristics of the substrate formed by the example method 1000 discussed herein with regard to FIGS. 1 and 2A-2I. Though the example substrate 100 will be discussed as the substrate 100 formed by the example method 1000, the scope of this disclosure is not limited thereto.

The example semiconductor die 210 is mounted on the second side 100b of the substrate 100. For example, the semiconductor die 210 is connected to exposed portions of the second wiring patterns 130 of the substrate 100 (e.g., to exposed traces, pads, lands, etc.) using the interconnection structures 220 (e.g., conductive bumps or balls, conductive posts or pillars, etc.). The interconnection structures 220 electrically and mechanically connect the semiconductor die 210 to the substrate 100. Note that in an alternative implementation, the back side of the die 210 may be bonded to the substrate and front side pads thereof may be connected to the second wiring patterns with bonded wires.

The underfill 230 fills a volume between the semiconductor die 210 and a region of the substrate 100 adjacent to the semiconductor die 210. The underfill 230 enhances physical/mechanical coupling forces between the substrate 100 and the semiconductor die 210 and prevents or inhibits the substrate 100 and the semiconductor die 210 from being separated from each other, for example due to stress applied by a difference in thermal expansion coefficient between the substrate 100 and the semiconductor die 210, due to stresses that may be applied due to contact of the fingerprint sensor device with a finger or external chassis of a consumer electronic device in which it is installed, etc.

In general, block 3010 may comprise mounting one or more electronic components. Thus, the scope of this disclosure should not be limited by characteristics of any particular electronic component or of any particular manner of mounting an electronic component.

The example method 3000 may, at block 3020, comprise forming conductive interconnection structures on the substrate. Block 3020 may comprise forming the interconnection structures in any of a variety of manners, non-limiting examples of which are provided herein.

The interconnection structures may, for example, be formed on the second side of the substrate (e.g., on the same side of the substrate to which electronic components are attached at block 3010). The interconnection structures may, for example, comprise conductive balls or bumps, solder balls or bumps, metal or copper core balls or bumps, metal posts or pillars, copper posts or pillars, wires, etc., but the scope of this disclosure is not limited thereto. The interconnection structures may, for example, be formed by ball dropping, bumping, plating, pasting and reflowing, printing, wire bonding, etc., but the scope of this disclosure is not limited thereto.

The interconnection structures may, for example, have a taller profile than the electronic component(s) attached at block 3010. For example, in an example implementation, the interconnection structures may be tall enough so that another component (e.g., electronic package, substrate, printed circuit board, flexible printed circuit, etc.) attached thereto will not impact the electronic component(s) attached to the substrate at the same side. In another example implementation, the interconnection structures may have a shorter profile than at least some, if not all, of the electronic components(s) attached at block 3010.

An example implementation 400A showing various aspects of block 3020 is shown at FIG. 4A. The example implementation 400A (or assembly, sub-assembly, package, etc.) comprises interconnection structures 240 (e.g., conductive balls, etc.) attached to the second side 100b of the substrate 100. For example, the interconnection structures 240 may be attached to exposed portions (e.g., pads, traces, lands, etc.) of the second wiring pattern 130 of the substrate 100.

In general, block 3020 may comprise forming conductive interconnection structures. Thus, the scope of this disclosure should not be limited by characteristics of any particular type of conductive interconnection structure or of any particular manner of forming a conductive interconnection structure.

The example method 3000 may, at block 3030, comprise singulating a device (e.g., a fingerprint sensor device) from a plurality of connected devices. Block 3030 may comprise performing the singulating in any of a variety of manners, non-limiting examples of which are provided herein.

Any or all of the operations discussed herein (e.g., any or all blocks of the example method 1000, block 3010, block 3020, etc.) may be performed at the wafer or panel level. In an example scenario in which this is the case, singulation (or dicing) may be performed. For example, block 3010 may comprise dicing a wafer of the substrates 100, cutting a panel of the substrates 100, etc. Such singulation may, for example, be performed by mechanical sawing or cutting, laser cutting, etc.

An example implementation 400A showing various aspects of block 3030 is shown at FIG. 4A. The example implementation 400A (or assembly, sub-assembly, package, etc.) comprises a single unitary substrate 100.

In general, block 3030 may comprise singulating a device. Thus, the scope of this disclosure should not be limited by characteristics of any particular manner of singulating.

The example method 3000 may, at block 3040, comprise attaching a flexible printed circuit (FPC). Block 3040 may comprise attaching the FPC in any of a variety of manners, non-limiting examples of which are provided herein.

The FPC may, for example, be attached over (e.g., fully or partially covering) one or more of the electronic components mounted at block 3010, and connected to at least a portion of the interconnection structures formed at block 3020. For example in an example implementation, interconnection structures formed at block 3020 may surround (e.g., on two, three, or four sides) the electronic component(s) mounted at block 3010. In this example implementation, the FPC may be positioned at block 3040 to partially or completely cover the electronic component(s). In another example implementation, for example in which the interconnection structures formed at block 3020 are only at one side of the electronic component(s) mounted at block 3010, the FPC might also cover the electronic component(s), but might not cover the component(s) at all.

The FPC, for example, provides electrical connectivity between one or more electronic components of the electronic device and an external device (e.g., a mother board, etc.). For example, in an example implementation in which the electronic component(s) attached at block 3010 comprises a sensor controller or processor, the FPC provides electrical connectivity between such sensor controller or processor and an electronic device outside of the sensor device (or package).

The FPC may comprise a layered structure of any of a variety of materials, for example one or more flexible conductive and dielectric layers (e.g., polyimide film, polyethylene terephthalate (PET), polyether ether ketone (PEEK), polyethylene naphthalate (PEN), polyetherimide (PEI), etc.).

Block 3040 may, for example, comprise attaching the FPC by soldering the FPC to the interconnection structures formed at block 3020 (e.g., using a hot bar or pad, mass reflow, laser soldering, etc.). Also for example, block 3040 may comprise attaching the FPC to the interconnection structures with a conductive epoxy.

Note that the FPC is merely an example, and any of a variety of components may be mounted to the interconnection structures formed at block 3020, instead of or in addition to the FPC. For example, other electronic component packages, flexible and/or rigid printed circuits, wires or cables, ribbon cable, substrates, packaging substrate, printed wire boards, etc., may be attached.

An example implementation 400B showing various aspects of block 3040 is shown at FIG. 4B. The example implementation 400B (or assembly, sub-assembly, package, etc.) comprises a flexible printed circuit (FPC) 310 attached to the interconnection structures. The FPC 310 may, for example, be considered to be extending out of the page of FIG. 4B.

In general, block 3040 may comprise attaching a flexible printed circuit (FPC). Thus, the scope of this disclosure should not be limited by characteristics of any particular FPC, or alternative attachment structure, or by characteristics of any particular manner of attaching thereof.

The example method 3000 may, at block 3050, comprise encapsulating the electronic device. Block 3050 may comprise performing the encapsulating in any of a variety of manners, non-limiting examples of which are provided herein.

The encapsulating material may, for example, cover any or all of the substrate, the electronic component(s) mounted at block 3010, the interconnection structures 3020 formed at block 3020, and/or the FPC attached at block 3040.

The encapsulating material may comprise any comprise any of a variety of encapsulating or molding materials (e.g., resin, silicon resin, epoxy resin, polymer, polymer composite material (for example, epoxy resin with filler, epoxy acrylate with filler, or polymer with a filler, any of the dielectric materials presented herein), etc. The encapsulant may be formed in any of a variety of manners (e.g., compression molding, transfer molding, liquid encapsulant molding, vacuum lamination, paste printing, film assisted molding, etc.).

An example implementation 400B showing various aspects of block 3050 is shown at FIG. 4B. The example implementation 400B (or assembly, sub-assembly, package, etc.) comprises an encapsulating material 330 that covers the substrate 100 (e.g., a second side 100b thereof), the semiconductor die 210, the underfill 230, the interconnection structures 240, the FPC 310, etc. The encapsulating material 330 may, for example, cover upper, lower, and side surfaces of the FPC 310. The first side 100a (e.g., at which the coating 150 is formed) of the substrate 100 is free of the encapsulating material, as are the lateral sides of the substrate 100. For example, the lateral sides of the substrate 100, including the coating 150, and the encapsulating material 330 may be coplanar.

As explained herein, the underfill 230 may comprise a molded underfill. In such an example implementation, the encapsulating material 330 may replace the underfill 230 in FIG. 4B.

In general, block 3050 may comprise encapsulating the electronic device. Thus, the scope of this disclosure should not be limited by characteristics of any particular encapsulating material and/or any particular manner of performing encapsulating.

The example method 3000 may, at block 3060, comprise housing (or covering) the electronic device. Block 3060 may comprise performing the housing (or covering) in any of a variety of manners, non-limiting examples of which are provided herein.

The housing may, for example, cover lateral sides of the electronic device and a side of the electronic device opposite the first wiring pattern utilized for sensing. For example, the coating discussed herein may be exposed from the housing to enable finger contact with the coating. The housing may comprise any of a variety of materials (e.g., plastics, metals, etc.). The housing may, for example, be adhered to the encapsulating material formed at block 3060.

Note that in an example implementation, a covering (or housing) might not be utilized, for example relying on the encapsulating material formed at block 3050 to protect the electronic device.

An example implementation 400B showing various aspects of block 3060 is shown at FIG. 4B. The example implementation 400B (or assembly, sub-assembly, package, etc.) comprises an upper housing portion 320b and a lower housing portion 320a coupled to the encapsulating material 330. The example upper housing portion 320b (or an end thereof) is also attached to and/or covers lateral sides of the substrate 100, including the coating 150. The example upper housing portion 320b is also beveled, for example at an end at which contact with a finger is expected or likely. In the example implementation 400B, five sides of the device may generally be protected by the housing 320a and 320b, and a sixth side may generally be protected by the coating 150.

In general, block 3060 may comprise housing (or covering) the electronic device. Thus, the scope of this disclosure should not be limited by characteristics of any particular housing and/or any particular manner of housing.

The example method 3000 may, at block 3095, comprise continuing the manufacturing (or processing), if necessary. Block 3095 may comprise continuing the manufacturing in any of a variety of methods, non-limiting examples of which are provided herein.

For example, block 3095 may comprise performing any of a variety of additional manufacturing or processing steps. For example, block 3095 may comprise performing additional package processing steps, attaching the package to another package or substrate, testing, marking, shipping, etc. For example, block 3095 may comprise incorporating the device into a consumer product (e.g., a smart phone, a button of a smart phone, a smart watch, portable computer, security system, etc.).

Also for example, block 3095 may comprise directing execution flow of the example method 3000 to any previous step of the example method 3000. Also for example, block 3095 may comprise directing execution flow of the example method 3000 to any other method disclosed herein (e.g., the example method 1000 of FIG. 1, or any portion thereof, etc.). Additional for example, block 3095 may comprise directing execution flow of the example method 3000 to any method, or portion thereof, that is not disclosed herein.

In general, block 3095 may comprise continuing the manufacturing (or processing). Thus, the scope of this disclosure should not be limited by characteristics of any particular manner or type of continued manufacturing (or processing).

The discussion herein included numerous illustrative figures that showed various portions of an electronic device (e.g., a sensor device) and method of manufacturing thereof. For illustrative clarity, such figures did not show all aspects of each example assembly. Any of the example assemblies and/or methods provided herein may share any or all characteristics with any or all other assemblies and/or methods provided herein. For example and without limitation, any of the example assemblies and/or methods shown and discussed with regard to FIGS. 1 and 2, or portions thereof, may be incorporated into any of the example assemblies and/or methods discussed with regard to FIGS. 3 and 4. Similarly, any of the assemblies and/or methods shown and discussed with regard to FIGS. 3 and 4 may be incorporated into the assemblies and/or methods shown and discussed with regard to FIGS. 1 and 2.

In summary, aspects of this disclosure provide an electronic device (e.g., a fingerprint sensor device) and a method of manufacturing thereof. As non-limiting examples, various aspects of this disclosure provide various fingerprint sensor devices, and methods of manufacturing thereof, that comprise a substrate comprising a dielectric layer and a wiring pattern embedded in and exposed from the dielectric layer. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A fingerprint sensor comprising:
   a substrate comprising a first substrate side, a second substrate side opposite the first substrate side, and a lateral substrate side extending between the first and second substrate sides;
   a semiconductor die coupled to the second substrate side; and
   a conductive interconnection structure coupled to the second substrate side and laterally offset from the semiconductor die; and
   a coating,
   wherein the substrate comprises:
      a first dielectric layer (DL) comprising a first DL side facing away from the semiconductor die and a second DL side facing toward the semiconductor die;
      a first wiring pattern embedded within the first dielectric layer and having a first side exposed at the first side of the first dielectric layer;
      a second dielectric layer covering the first side of the first dielectric layer and the first side of the first wiring pattern; and
   wherein the coating is positioned on a first side of the second dielectric layer opposite a second side of the second dielectric layer that faces the first dielectric layer.

2. The fingerprint sensor of claim 1, wherein the first DL side and the first side of the first wiring pattern are coplanar.

3. The fingerprint sensor of claim 1, comprising:
   a second wiring pattern on and contacting the second DL side; and
   a conductive via electrically coupling the second wiring pattern to the first wiring pattern.

4. The fingerprint sensor of claim 3, wherein the conductive via passes straight through the first dielectric layer.

5. The fingerprint sensor of claim 3, comprising a third dielectric layer covering at least portions of the second DL side between traces of the second wiring pattern, wherein a first side of the third dielectric layer is generally coplanar with a first side of the second wiring pattern.

6. The fingerprint sensor of claim 1, wherein the first dielectric layer and second dielectric layer are made of different respective materials.

7. The fingerprint sensor of claim 1, wherein the coating comprises glass.

8. The fingerprint sensor of claim 1, wherein the coating comprises one or more of: an acrylic resin, an epoxy resin, a polyester resin, a silicon resin, a polyurethane resin, a polymeric resin, a photopolymerizable resin, a hard coating liquid, and/or a high molecular weight polymer.

9. The fingerprint sensor of claim 1, comprising a flexible printed circuit coupled to the conductive interconnection structure and covering a side of the semiconductor die opposite the substrate.

10. The fingerprint sensor of claim 1, comprising:
    a flexible printed circuit (FPC) comprising a first FPC side coupled to the conductive interconnection structure, and a second FPC side opposite the first FPC side; and
    an encapsulating material that covers at least a portion of each of: the second substrate side, the semiconductor die, the conductive interconnection structure, the first FPC side, and the second FPC side, but not the lateral substrate side.

11. A fingerprint sensor comprising:
    a substrate comprising a first substrate side and a second substrate side opposite the first substrate side;
    a semiconductor die coupled to the second substrate side;
    a conductive interconnection structure coupled to the second substrate side and laterally offset from the semiconductor die; and
    a printed circuit board (PC) comprising a first PC side coupled to the conductive interconnection structure and a second PCB side opposite the first PC side; and
    an encapsulating material that covers at least a portion of each of: the second substrate side, the conductive interconnection structure, the first PC side, and the second PC side,
    wherein the substrate comprises:
       a first dielectric layer (DL) comprising a first DL side facing away from the semiconductor die and a second DL side opposite the first DL side;
       a first wiring pattern at the first DL side; and
       a second dielectric layer covering the first DL side and the first wiring pattern.

12. The fingerprint sensor of claim 11, wherein the first wiring pattern is embedded in the first dielectric layer, and a first side of the first wiring pattern is coplanar with the first DL side.

13. The fingerprint sensor of claim 11, wherein the second dielectric layer comprises one or more of: a resin and/or a hard coating liquid.

14. The fingerprint sensor of claim 11, comprising a coating on a first side of the second dielectric layer opposite a second side of the second dielectric layer that faces the first dielectric layer.

15. The fingerprint sensor of claim 11, wherein the printed circuit board comprises a flexible printed circuit board (PCB).

16. A fingerprint sensor comprising:
    a substrate comprising:
       a first dielectric layer (DL) comprising a first DL side and a second DL side opposite the first DL side;
       a first wiring pattern, at least a portion of which is configured to sense a fingerprint, embedded within the first DL side, and comprising a first side exposed at the first DL side;
       a second dielectric layer covering the first side of the first dielectric layer and the first side of the first wiring pattern;
       a second wiring pattern, at least a portion of which is configured for attachment to a semiconductor die, on the second DL side; and
       a third dielectric layer covering at least portions of the second DL side between traces of the second wiring pattern, wherein a first side of the third dielectric layer is generally coplanar with a first side of the second wiring pattern.

17. The fingerprint sensor of claim 16, wherein the second and third dielectric layers are made of a same material.

18. The fingerprint sensor of claim 16, wherein the second wiring pattern comprises a side facing away from the first dielectric layer and coplanar with a side of the third dielectric layer.

19. The fingerprint sensor of claim 16, wherein the first side of the first wiring pattern is coplanar with the first DL side.

20. The fingerprint sensor of claim 19, comprising a coating on a first side of the second dielectric layer opposite a second side of the second dielectric layer that faces the first dielectric layer.

* * * * *